United States Patent
Kim

(10) Patent No.: US 11,658,203 B2
(45) Date of Patent: May 23, 2023

(54) DISPLAY APPARATUS USING SEMICONDUCTOR LIGHT-EMITTING DEVICE

(71) Applicant: LG ELECTRONICS INC., Seoul (KR)

(72) Inventor: Junghoon Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 195 days.

(21) Appl. No.: 16/964,838

(22) PCT Filed: Jan. 26, 2018

(86) PCT No.: PCT/KR2018/001163
§ 371 (c)(1),
(2) Date: Jul. 24, 2020

(87) PCT Pub. No.: WO2019/146816
PCT Pub. Date: Aug. 1, 2019

(65) Prior Publication Data
US 2021/0066388 A1    Mar. 4, 2021

(51) Int. Cl.
*H01L 27/15* (2006.01)
*H01L 33/38* (2010.01)
*H01L 33/62* (2010.01)

(52) U.S. Cl.
CPC ............ *H01L 27/156* (2013.01); *H01L 33/38* (2013.01); *H01L 33/62* (2013.01)

(58) Field of Classification Search
CPC ....... H01L 27/156; H01L 33/38; H01L 33/62; H01L 33/0095; H01L 33/36; H01L 33/52
See application file for complete search history.

(56) References Cited

U.S. PATENT DOCUMENTS

| | | | |
|---|---|---|---|
| 6,420,735 B2* | 7/2002 | Kim | H01L 33/20 257/E33.068 |
| 6,514,782 B1* | 2/2003 | Wierer, Jr. | H01L 25/0753 257/E33.068 |
| 10,074,676 B2 | 9/2018 | Jeon et al. | |
| 2005/0189558 A1* | 9/2005 | Liu | H01L 33/20 257/E33.068 |

(Continued)

FOREIGN PATENT DOCUMENTS

JP    2010-62425 A    3/2010
KR    10-0563061 B1    3/2006

(Continued)

*Primary Examiner* — Su C Kim
(74) *Attorney, Agent, or Firm* — Birch, Stewart, Koalsch & Birch, LLP

(57) ABSTRACT

Discussed is a display apparatus including a substrate having a wiring electrode; and a semiconductor light-emitting device that emits light to an upper surface thereof, has a conductive electrode electrically connected to the wiring electrode on a lower surface thereof, and has at least a side surface of which is covered by a passivation layer, wherein the conductive electrode comprises: an insulating region further covered by the passivation layer, and a concave-convex region exposed by the passivation layer and electrically connected to the wiring electrode, a surface of the concave-convex portion being formed with concavity and convexity.

20 Claims, 13 Drawing Sheets

(56) References Cited

U.S. PATENT DOCUMENTS

| | | | |
|---|---|---|---|
| 2009/0315054 A1* | 12/2009 | Kim | H01L 33/44 |
| | | | 257/98 |
| 2011/0057211 A1 | 3/2011 | Lee et al. | |
| 2016/0133679 A1 | 5/2016 | Jeon et al. | |
| 2016/0240517 A1* | 8/2016 | Kim | H01L 25/0753 |
| 2016/0315068 A1* | 10/2016 | Lee | H01L 33/46 |
| 2018/0138235 A1 | 5/2018 | Lee | |

FOREIGN PATENT DOCUMENTS

| | | |
|---|---|---|
| KR | 10-2010-0063534 A | 6/2010 |
| KR | 10-1077789 B1 | 10/2011 |
| KR | 10-2016-0055369 A | 5/2016 |
| KR | 10-2016-0101571 A | 8/2016 |
| KR | 10-2016-0118040 A | 10/2016 |
| KR | 10-2016-0126779 A | 11/2016 |
| KR | 10-2016-0142673 A | 12/2016 |

\* cited by examiner

DISPLAY APPARATUS USING SEMICONDUCTOR LIGHT-EMITTING DEVICE

CROSS REFERENCE TO RELATED APPLICATIONS

This application is the National Stage filing under 35 U.S.C. 371 of International Application No. PCT/KR2018/001163 filed on Jan. 26, 2018, which is hereby expressly incorporated by reference into the present application.

BACKGROUND

1. Technical Field

The present disclosure relates to a display apparatus, and more particularly, to a display apparatus using a semiconductor light-emitting device.

2. Description of the Related Art

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as weakness in flexibility in case of AMOLEDs.

On the other hand, light emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting devices may be used to implement a flexible display, thereby presenting a scheme for solving the problems.

In a display using the semiconductor light-emitting devices, the semiconductor light-emitting devices grown on a growth substrate may be transferred onto a wiring substrate. However, when performing the transfer, due to a weak shear force between the semiconductor light-emitting device and bonding materials, a defect may occur, thereby increasing fabrication cost.

Accordingly, the present disclosure proposes a semiconductor light-emitting device structure having structural stability in a display apparatus through a strong shear force to a conductive electrode.

SUMMARY

A technical problem to be solved by the present disclosure is to provide a structure of a semiconductor light-emitting device with improved stability and reliability when transferring the semiconductor light-emitting device to a wiring substrate in a display apparatus.

Furthermore, another technical problem to be solved by the present disclosure is to provide a display apparatus in which a semiconductor light-emitting device is coupled to a wiring substrate with a strong shear force.

In a display apparatus according to the present disclosure, an interface of a conductive electrode of the semiconductor light-emitting device may be formed with a texturing surface, thereby securing strong shear force and structural stability.

More specifically, a display apparatus may include a substrate having a wiring electrode, and a semiconductor light-emitting device that emits light to an upper surface thereof, and has a conductive electrode electrically connected to the wiring electrode on a lower surface thereof, a side surface of which is covered by a passivation layer, wherein the conductive electrode includes an insulating region covered by the passivation layer, and a concave-convex region disposed on a through hole of the passivation layer and electrically connected to the wiring electrode, a surface of which is formed with concavity and convexity.

According to an embodiment, the concave-convex region may be formed in a portion where the wiring electrode and the conductive electrode overlap with each other. The conductive electrode may be a p-type electrode, and an n-type electrode may be disposed on an upper surface of the semiconductor light-emitting device. The conductive electrode may include a p-type electrode and an n-type electrode, and the concave-convex region may be formed on the p-type electrode and the n-type electrode, respectively.

According to an embodiment, the conductive electrode may have one or more metal layers, and the metal layers may include an antioxidant layer formed of at least one of gold (Au), silver (Ag) and platinum (Pt). The concave-convex region may be formed on a surface of the antioxidant layer.

A surface of the insulating region may be formed with a flat surface.

According to an embodiment, the display apparatus may further include an adhesive electrode disposed between the conductive electrode and the passivation layer in the insulating region.

The passivation layer may include a first insulating portion formed on a lower surface of the conductive electrode, and a second insulating portion extended from a side surface of the conductive electrode to a side surface of a first conductive semiconductor layer and a side surface of a second conductive semiconductor layer of the semiconductor light-emitting device. An insulating interface may be formed between the first conductive electrode and the first insulating portion, and the adhesive electrode may be disposed on the insulating interface. The adhesive electrode may include at least one of titanium (Ti), chromium (Cr) and nickel (Ni).

According to an embodiment, the wiring electrode and the conductive electrode may be electrically connected by solder, and a plurality of grooves corresponding to a protruding portion of the concave-convex region may be formed on the solder.

According to an embodiment, a plurality of grooves may be formed on an upper surface of the semiconductor light-emitting device. A reflective layer may be formed under the wiring electrode. The substrate may include grooves formed between the semiconductor light-emitting devices, and sequentially arranged in one direction.

DETAILED DESCRIPTION OF THE EMBODIMENTS

Figure 1:
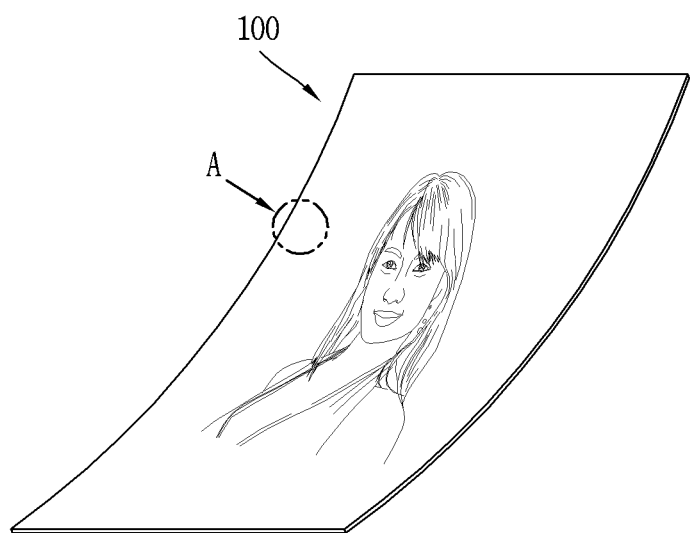
FIG. 1 is a conceptual view showing a display apparatus using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display apparatus using a semiconductor light-emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting device. According to the present disclosure, a light emitting diode (LED) is illustrated as a type of semiconductor light-emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
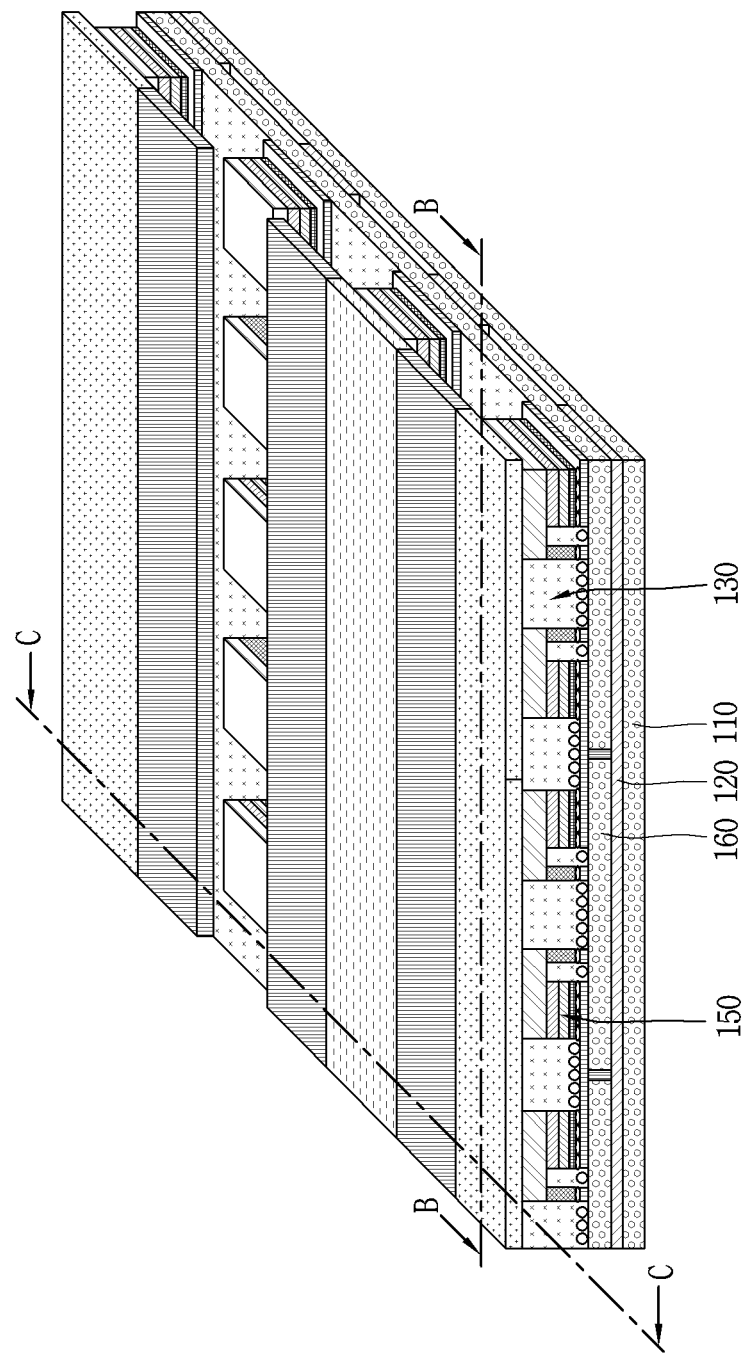
FIG. 2 is a partial enlarged view of portion "A" in FIG. 1, and FIGS. 3A and 3B are cross-sectional views taken along lines B-B and C-C in FIG. 2.
Figure 3A:
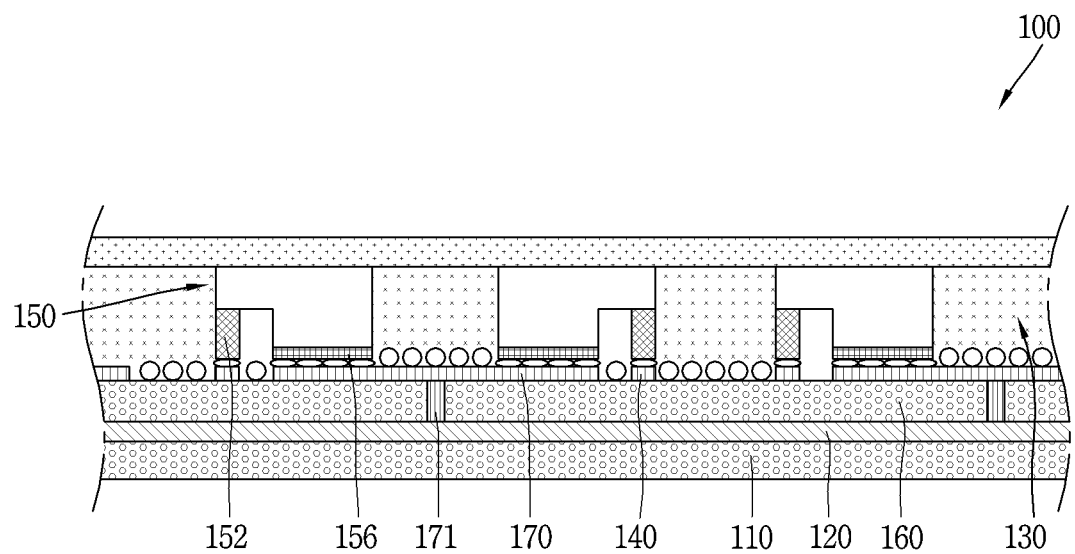
Figure 3B:
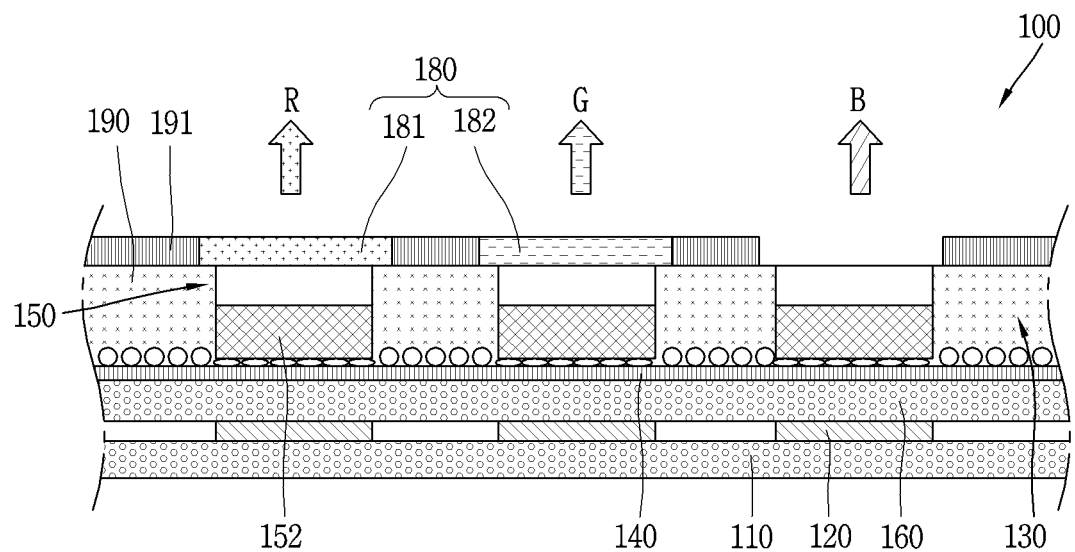
Figure 4:
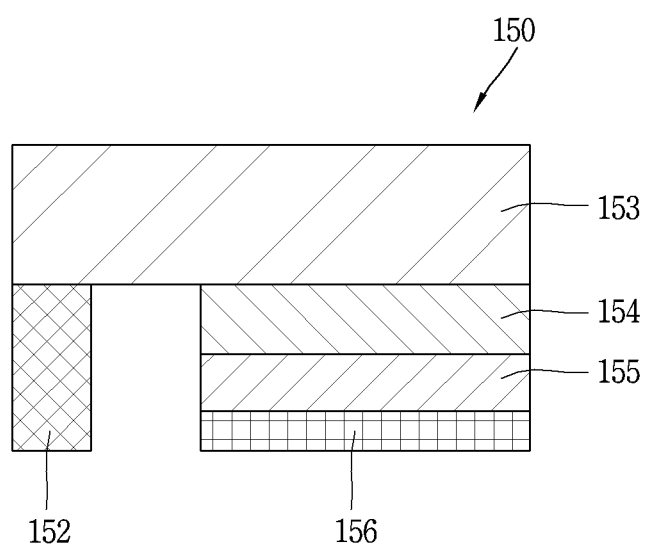
FIG. 4 is a conceptual view showing a flip-chip type semiconductor light-emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting device in FIG. 3A, and FIGS. 5A through 5C are conceptual views illustrating various forms for implementing colors in connection with a flip-chip type semiconductor light-emitting device.

According to the drawings in FIGS. 2, 3A and 3B, there is illustrated a display apparatus 100 using a passive matrix (PM) type semiconductor light-emitting device as a display apparatus 100 using a semiconductor light-emitting device. However, an example described below may also be applicable to an active matrix (AM) type semiconductor light-emitting device.

The display apparatus 100 may include a first substrate 110, a first electrode 120, a conductive adhesive layer 130, a second electrode 140, and a plurality of semiconductor light-emitting devices 150.

The first substrate 110 may be a flexible substrate. The first substrate 110 may contain glass or polyimide (PI) to implement the flexible display apparatus. In addition, if it is an insulating and flexible material, any one such as polyethylene naphthalate (PEN), polyethylene terephthalate (PET) or the like may be used. Furthermore, the first substrate 110 may be either one of transparent and non-transparent materials.

The first substrate 110 may be a wiring substrate disposed with the first electrode 120, and thus the first electrode 120 may be placed on the first substrate 110.

According to the drawing, an insulating layer 160 may be disposed on the first substrate 110 placed with the first electrode 120, and an auxiliary electrode 170 may be placed on the insulating layer 160. In this case, a configuration in which the insulating layer 160 is deposited on the first substrate 110 may be a single wiring substrate. More specifically, the insulating layer 160 may be incorporated into the first substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the first substrate 110 with no insulating layer 160. The conductive adhesive layer 130 may perform the role of an insulating layer in the structure in which the conductive adhesive layer 130 is disposed on the first substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting device 150 is connect thereto in a flip chip form with the application of heat and pressure, the semiconductor light-emitting device 150 is electrically connected to the first electrode 120 and second electrode 140.

Referring to FIG. 4, the semiconductor light-emitting device may be a flip chip type semiconductor light-emitting device.

For example, the semiconductor light-emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting devices 150. For example, the left and right p-type electrodes of the semiconductor light-emitting devices around the auxiliary electrode may be electrically connected to one auxiliary electrode.

More specifically, the semiconductor light-emitting device 150 is pressed into the conductive adhesive layer 130, and through this, only a portion between the p-type electrode 156 and auxiliary electrode 170 of the semiconductor light-emitting device 150 and a portion between the n-type electrode 152 and second electrode 140 of the semiconductor light-emitting device 150 have conductivity, and the remaining portion does not have conductivity since there is no push-down of the semiconductor light-emitting device. As described above, the conductive adhesive layer 130 may form an electrical connection as well as allow a mutual coupling between the semiconductor light-emitting device 150 and the auxiliary electrode 170 and between the semiconductor light-emitting device 150 and the second electrode 140.

Furthermore, a plurality of semiconductor light-emitting devices 150 constitute a light-emitting array, and a phosphor layer 180 is formed on the light-emitting array.

The light-emitting device array may include a plurality of semiconductor light-emitting devices with different self-luminance values. Each of the semiconductor light-emitting devices 150 constitutes a sub-pixel, and is electrically connected to the first electrode 120. For example, there may exist a plurality of first electrodes 120, and the semiconductor light-emitting devices are arranged in several rows, for instance, and each row of the semiconductor light-devices may be electrically connected to any one of the plurality of first electrodes.

Furthermore, the semiconductor light-emitting devices may be connected in a flip chip form, and thus semiconductor light-emitting devices grown on a transparent dielectric substrate. Furthermore, the semiconductor light-emitting devices may be nitride semiconductor light-emitting devices, for instance. The semiconductor light-emitting device 150 may have excellent luminance characteristics, and thus it may be possible to configure individual sub-pixels even with a small size thereof.

According to the drawing, a partition wall 190 may be formed between the semiconductor light-emitting devices 150. The semiconductor light-emitting device 150 may have excellent luminance characteristics, and thus it may be possible to configure individual sub-pixels even with a small size thereof. For example, a base member of the anisotropic conductive film may form the partition wall when the semiconductor light-emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting device 150. For example, the semiconductor light-emitting device 150 is a blue semiconductor light-emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting device 151 at a position implementing a red sub-pixel, and a green phosphor 182 capable of converting blue light into green (G) light may be deposited on the blue semiconductor light-emitting device 151 at a position implementing a green sub-pixel. Furthermore, only the blue semiconductor light-emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting device 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
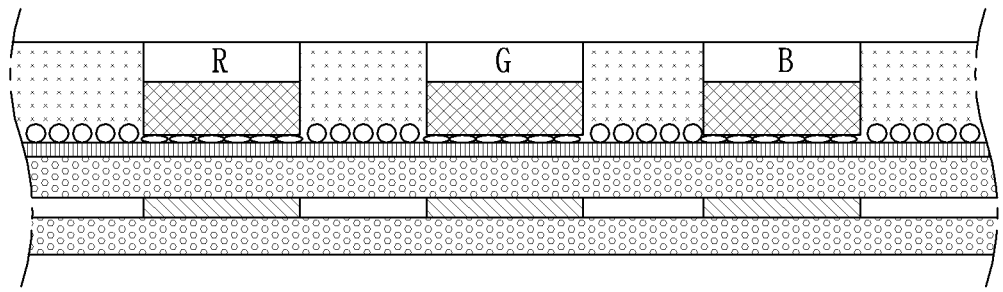
FIGS. 5A through 5C are conceptual views illustrating various forms for implementing colors in connection with a flip-chip type semiconductor light-emitting device.

Referring to FIG. 5A, each of the semiconductor light-emitting devices 150 may be implemented with a high-power light-emitting device that emits various lights including blue in which gallium nitride (GaN) is mostly used, and indium (In) and or aluminum (Al) are added thereto.

In this case, the semiconductor light-emitting device 150 may be red, green and blue semiconductor light-emitting devices, respectively, to implement each sub-pixel. For instance, red, green and blue semiconductor light-emitting devices (R, G, B) are alternately disposed, and red, green and blue sub-pixels implement one pixel by means of the red, green and blue semiconductor light-emitting devices, thereby implementing a full color display.

Figure 5B:
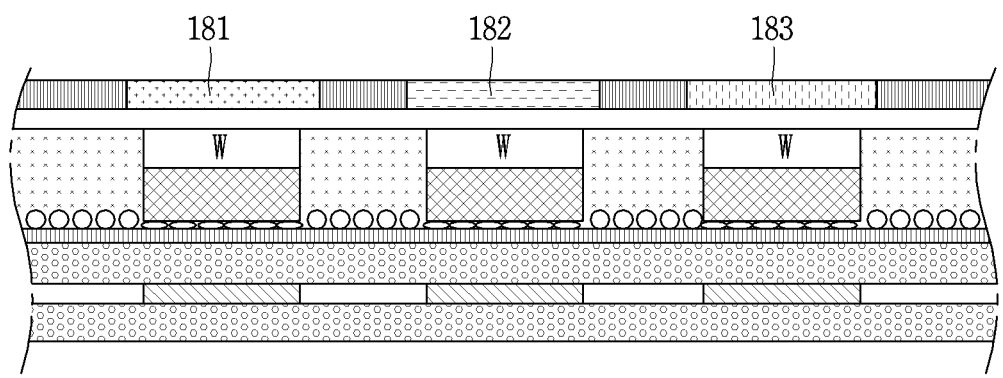

Referring to FIG. 5B, the semiconductor light-emitting device may have a white light-emitting device (W) provided with a yellow phosphor layer for each element. In this case, a red phosphor layer 181, a green phosphor layer 182 and blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
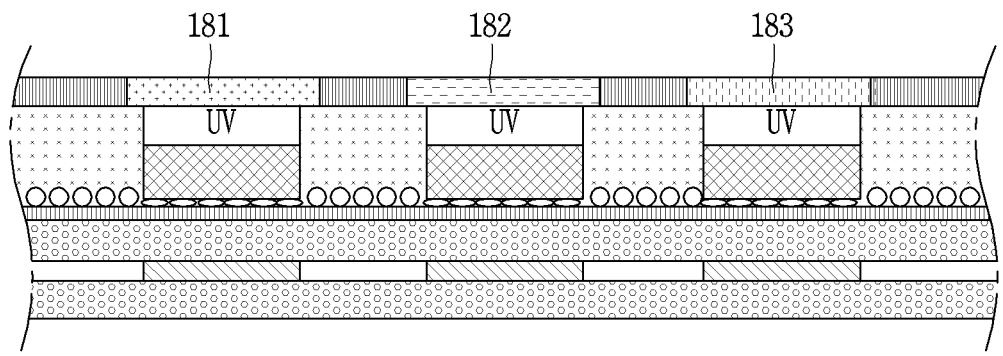

Referring to FIG. 5C, it may be possible to also have a structure in which a red phosphor layer 181, a green phosphor layer 182 and blue phosphor layer 183 may be provided on a ultra violet light-emitting device (UV). In this manner, the semiconductor light-emitting device can be used over the entire region up to ultra violet (UV) as well as visible light, and may be extended to a form of semiconductor light-emitting device in which ultra violet (UV) can be used as an excitation source.

Taking the present example into consideration again, the semiconductor light-emitting device 150 is placed on the conductive adhesive layer 130 to constitute a sub-pixel in the display apparatus. The semiconductor light-emitting device 150 may have excellent luminance characteristics, and thus it may be possible to configure individual sub-pixels even with a small size thereof. The size of the individual semiconductor light-emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light-emitting device 150 with a length of side of 10 µm is used for a sub-pixel, it will exhibit a sufficient brightness for implementing a display apparatus. Accordingly, for example, in case of a rectangular pixel in which one side of a sub-pixel is 600 µm in size, and the remaining one side thereof is 300 µm, a relative distance between the semiconductor light-emitting devices becomes sufficiently large. Accordingly, in this case, it may be possible to implement a flexible display apparatus having a HD image quality.

A display apparatus using the foregoing semiconductor light-emitting device will be fabricated by a new type of fabrication method. Hereinafter, the fabrication method will be described with reference to FIG. 6.

Figure 6:
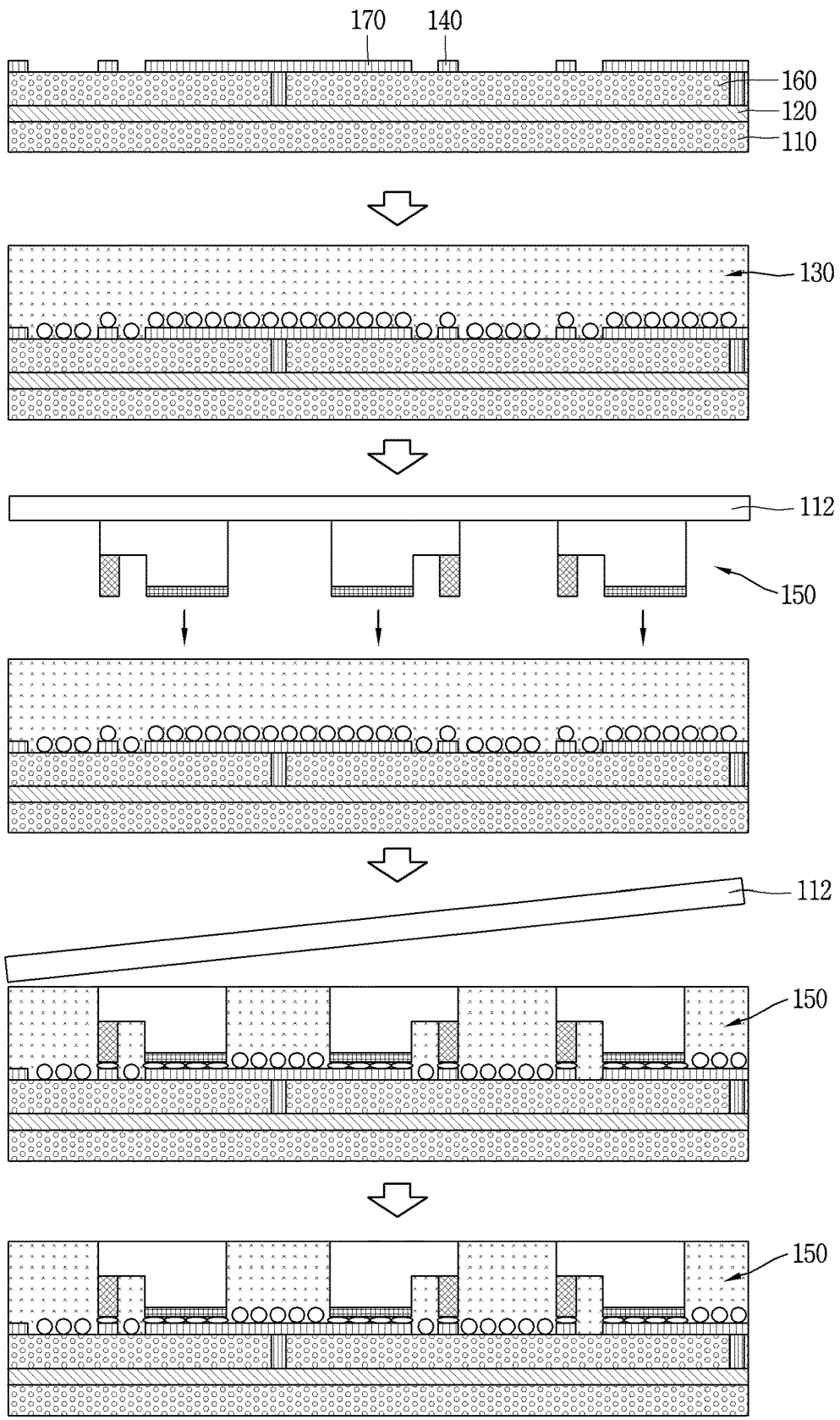
FIG. 6 is cross-sectional views showing a fabrication method of a display apparatus using a semiconductor light-emitting device according to the present disclosure.

FIG. 6 is cross-sectional views showing a fabrication method of a display apparatus using a semiconductor light-emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting devices 150 corresponding to the location of the auxiliary electrodes 170 and second electrodes 140 and constituting individual pixels is disposed such that the semiconductor light-emitting device 150 faces the auxiliary electrode 170 and second electrode 140.

In this case, the second substrate 112 as a growth substrate for growing the semiconductor light-emitting device 150 may be a sapphire substrate or silicon substrate.

The semiconductor light-emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting device 150 and the auxiliary electrode 170 and second electrode 140 may have conductivity due to the characteristics of an anisotropic conductive film having conductivity by thermal compression, thereby allowing the electrodes and semiconductor light-emitting device 150 to be electrically connected to each other. At this time, the semiconductor light-emitting device 150 may be inserted into the anisotropic conductive film, thereby forming a partition wall between the semiconductor light-emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting devices 150 to the outside. Silicon oxide (SiOx) or the like may be coated on the wiring substrate coupled to the semiconductor light-emitting device 150 to form a transparent insulating layer (not shown).

Furthermore, it may further include the process of forming a phosphor layer on one surface of the semiconductor light-emitting device 150. For example, the semiconductor light-emitting device 150 may be a blue semiconductor light-emitting device for emitting blue (B) light, and red or green phosphor for converting the blue (B) light into the color of the sub-pixel may form a layer on one surface of the blue semiconductor light-emitting device.

The fabrication method or structure of a display apparatus using the foregoing semiconductor light-emitting device may be modified in various forms. For such an example, the foregoing display apparatus may be applicable to a vertical semiconductor light-emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
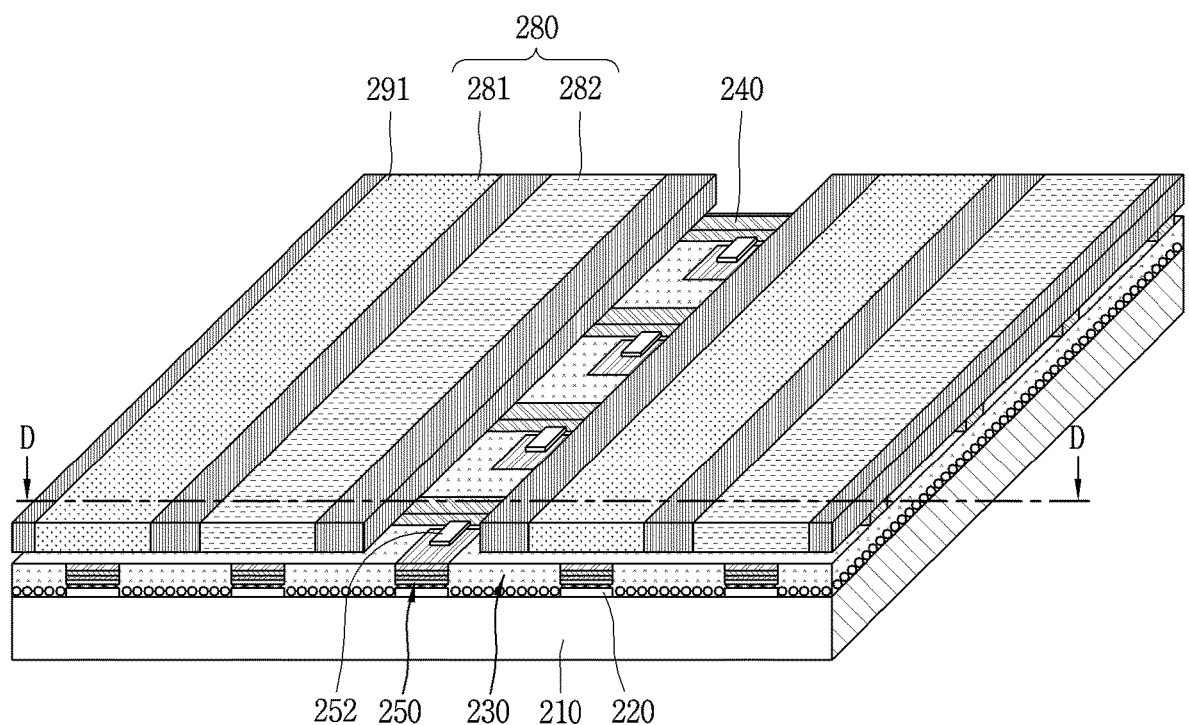
FIG. 7 is a perspective view showing a display apparatus using a semiconductor light-emitting device according to another embodiment of the present disclosure.
Figure 8:
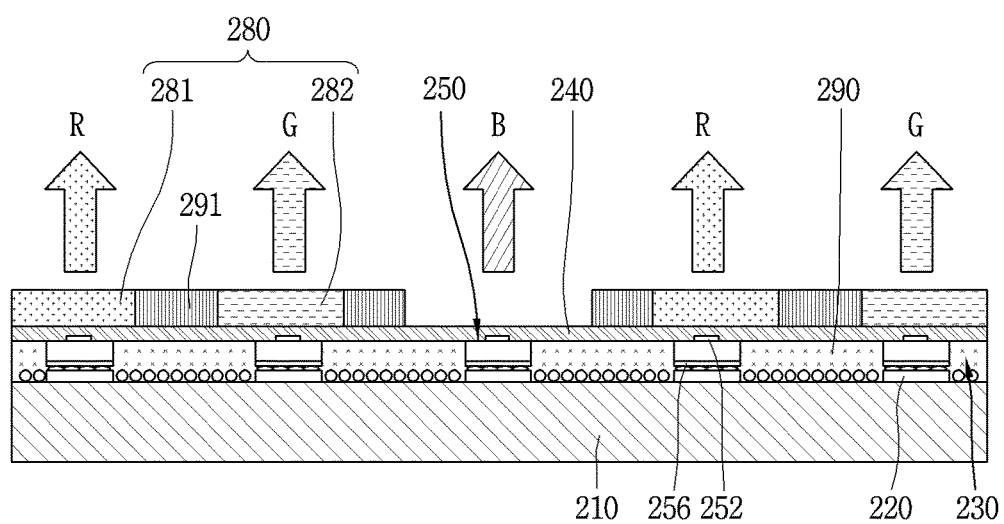
FIG. 8 is a cross-sectional view taken along line D-D in FIG. 7.
Figure 9:
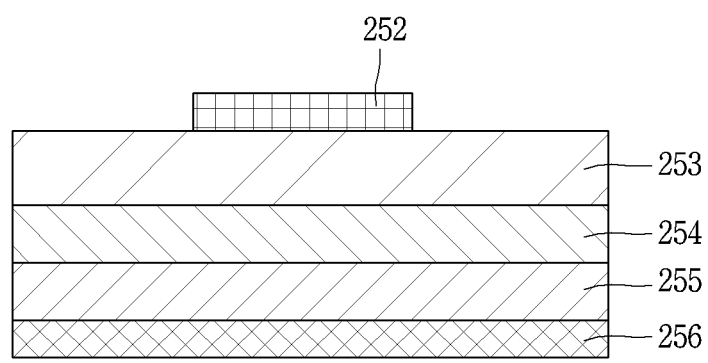
FIG. 9 is a conceptual view showing a vertical semiconductor light-emitting device in FIG. 8.

FIG. 7 is a perspective view illustrating a display apparatus using a semiconductor light-emitting device according to another embodiment of the present disclosure. FIG. 8 is a cross-sectional view taken along line C-C in FIG. 7, and FIG. 9 is a conceptual view illustrating a vertical type semiconductor light-emitting device in FIG. 8.

According to the drawings, the display apparatus may be display apparatus using a passive matrix (PM) type of vertical semiconductor light-emitting device.

The display apparatus may include a substrate 210, a first electrode 220, a conductive adhesive layer 230, a second electrode 240 and a plurality of semiconductor light-emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display apparatus to which a flip chip type light-emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting device 250 thereto, the semiconductor light-emitting device 250 is electrically connected to the first electrode 220. At this time, the semiconductor light-emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting device 250 and the first electrode 220.

In this manner, the semiconductor light-emitting device 250 is placed on the conductive adhesive layer 230, thereby configuring a separate sub-pixel in the display apparatus. The semiconductor light-emitting device 250 may have excellent luminance characteristics, and thus it may be possible to configure individual sub-pixels even with a small size thereof. The size of the individual semiconductor light-emitting device 250 may be less than 80 μm in the length of one side thereof, and formed with a rectangular or square shaped element. In case of a rectangular shaped element, the size thereof may be less than 20×80 μm.

The semiconductor light-emitting device 250 may be a vertical structure.

A plurality of second electrodes 240 disposed in a direction of crossing the length direction of the first electrode 220, and electrically connected to the vertical semiconductor light-emitting device 250 may be located between vertical semiconductor light-emitting devices.

Referring to FIG. 9, the vertical semiconductor light-emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting device 250, thereby providing a great advantage capable of reducing the chip size.

Referring again to FIG. 8, a phosphor layer 280 may be formed on one surface of the semiconductor light-emitting device 250. For example, the semiconductor light-emitting device 250 is a blue semiconductor light-emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting device 251 at a position implementing a red sub-pixel, and a green phosphor 282 capable of converting blue light into green (G) light may be deposited on the blue semiconductor light-emitting device 251 at a position implementing a green sub-pixel. Furthermore, only the blue semiconductor light-emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light-emitting device is applied.

Taking the present embodiment into consideration again, the second electrode 240 is located between the semiconductor light-emitting devices 250, and electrically connected to the semiconductor light-emitting devices 250. For example, the semiconductor light-emitting devices 250 may be disposed in a plurality of rows, and the second electrode 240 may be located between the rows of the semiconductor light-emitting devices 250.

Since a distance between the semiconductor light-emitting devices 250 constituting individual pixels is sufficiently large, the second electrode 240 may be located between the semiconductor light-emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light-emitting device 250 by a connecting electrode protruded from the second electrode 240. More specifically, the connecting electrode may be an n-type electrode of the semiconductor light-emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting device 250, the ITO material has a problem of bad adhesiveness with an n-type semiconductor. Accordingly, the second electrode 240 may be placed between the semiconductor light-emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting devices 250. In other words, the partition wall 290 may be disposed between the vertical semiconductor light-emitting devices 250 to isolate the semiconductor light-emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display apparatus.

If the second electrode 240 is precisely located on the conductive adhesive layer 230 between the semiconductor light-emitting devices 250, the partition wall 290 may be located between the vertical semiconductor light-emitting device 250 and second electrode 240. Accordingly, individual sub-pixels may be configured even with a small size using the semiconductor light-emitting device 250, and a distance between the semiconductor light-emitting devices 250 may be relatively sufficiently large to place the second electrode 240 between the semiconductor light-emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting device 250 is located on the conductive adhesive layer 230, thereby constituting individual pixels on the display apparatus. The semiconductor light-emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting device.

In the display apparatus of the present disclosure described above, the semiconductor light-emitting device of the growth substrate on which the semiconductor light-emitting device is grown must be transferred to a wiring substrate. However, when performing the transfer, due to a weak shear force between the semiconductor light-emitting device and bonding materials, a defect may occur, thereby increasing fabrication cost.

In the present disclosure, a semiconductor light-emitting device having a new structure capable of solving such a problem will be presented. Hereinafter, a display apparatus to which a semiconductor light-emitting device having a new structure is applied will be described in more detail with reference to the drawings.

Figure 10:
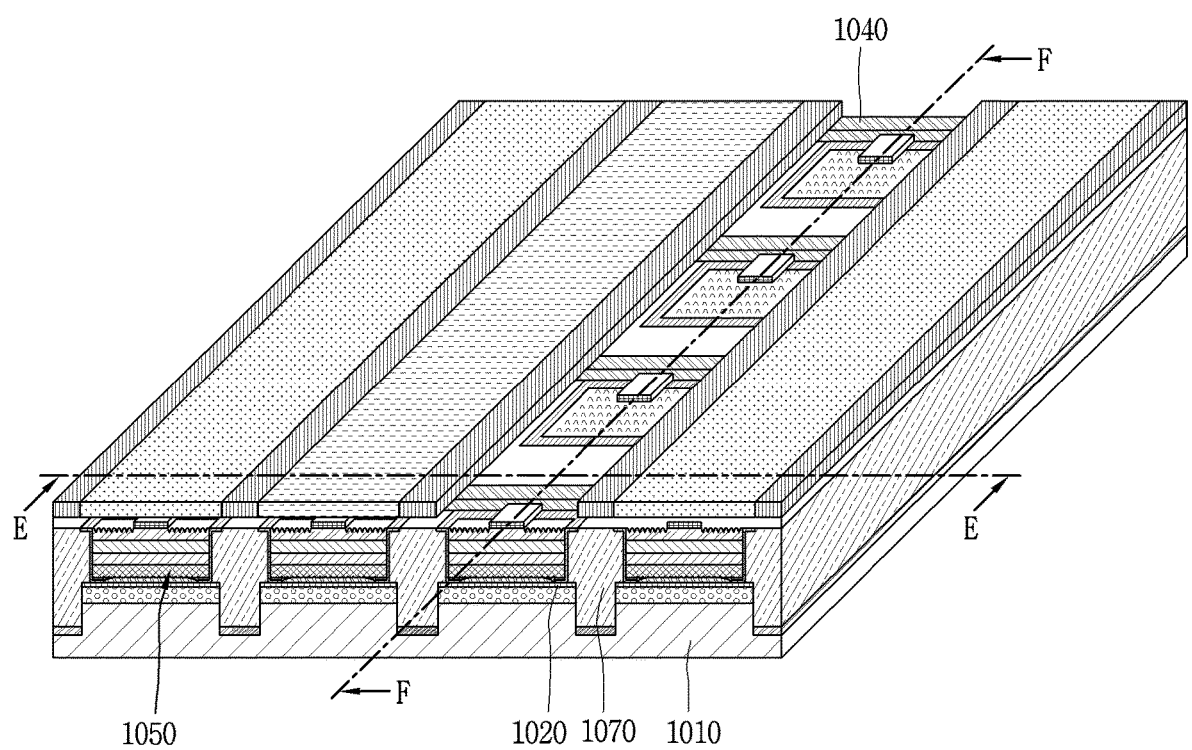
FIG. 10 is an enlarged view of portion "A" in FIG. 1 for explaining another embodiment of the present disclosure to which semiconductor light-emitting devices having a new structure are applied.
Figure 11:
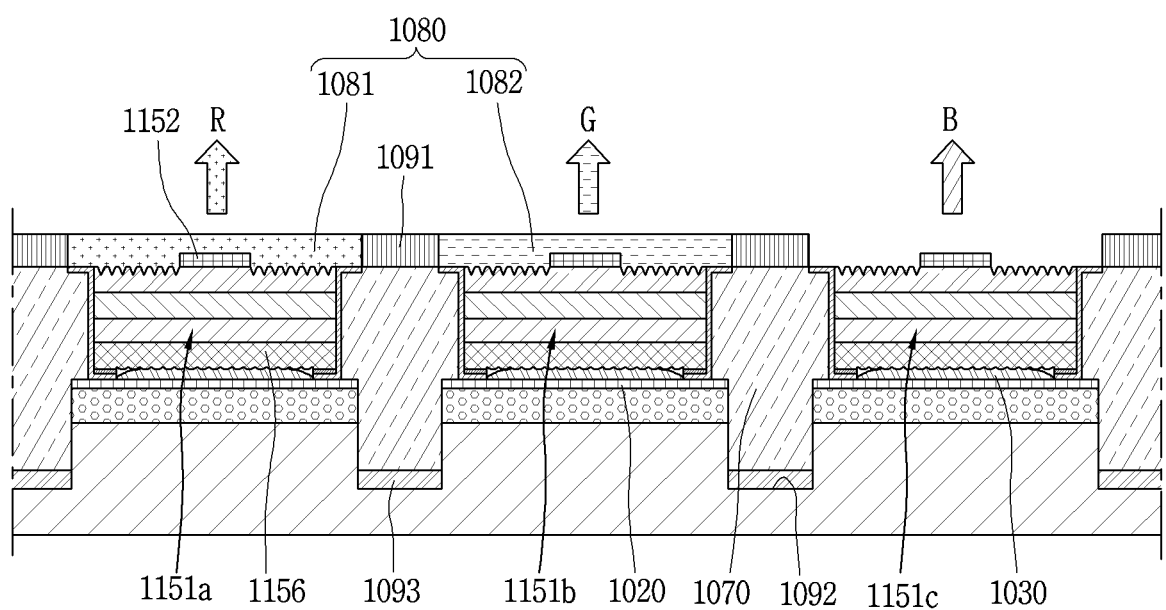
FIG. 11 is a cross-sectional view taken along line E-E in FIG. 10 according to an embodiment of the present disclosure.
Figure 12:
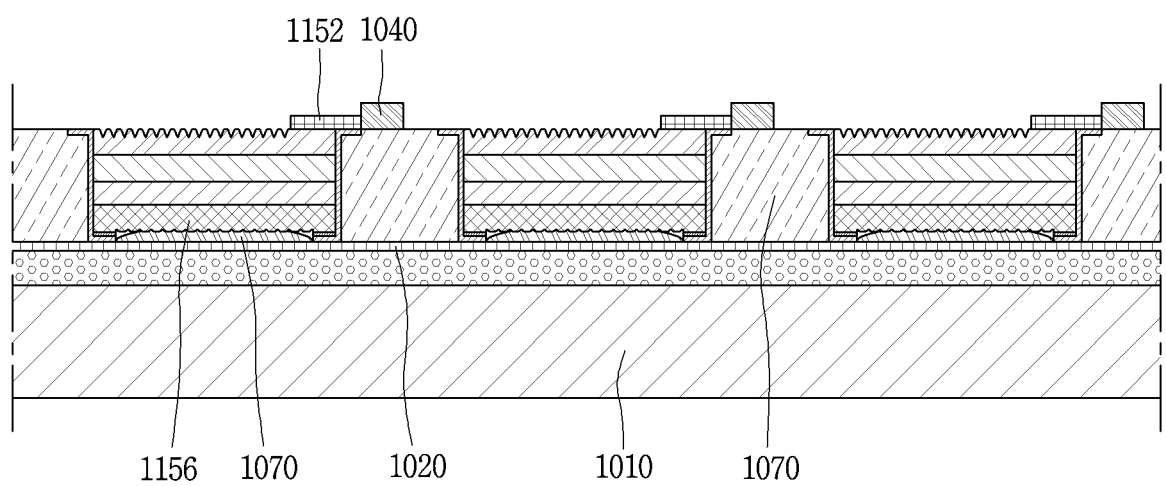
FIG. 12 is a cross-sectional view taken along line F-F in FIG. 10 according to an embodiment of the present disclosure.
Figure 13:
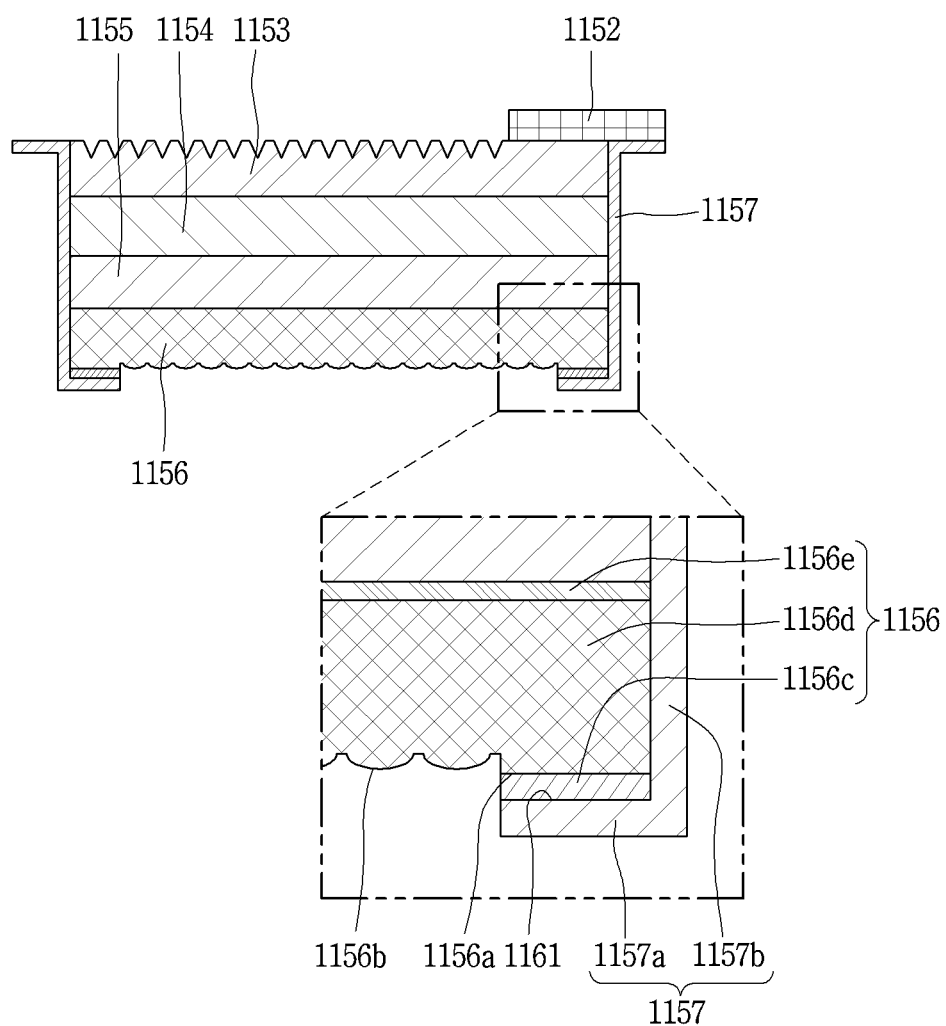
FIG. 13 is a conceptual view illustrating a semiconductor light-emitting device in FIG. 13 according to an embodiment of the present disclosure.

FIG. 10 is an enlarged view of portion "A" in FIG. 1 for explaining another embodiment of the present disclosure to which a semiconductor light-emitting device having a new structure is applied, FIG. 11 is a cross-sectional view taken along line E-E in FIG. 10, FIG. 12 is a cross-sectional view taken along line F-F in FIG. 10, and FIG. 13 is a conceptual view illustrating a semiconductor light-emitting device having a new structure.

According to the drawings in FIGS. 10, 11 and 12, there is illustrated a display apparatus 1000 using a passive matrix (PM) type semiconductor light-emitting device as a display apparatus 1000 using a semiconductor light-emitting device. However, an example described below may also be applicable to an active matrix (AM) type semiconductor light-emitting device.

The display apparatus 1000 may include a substrate 1010, a first electrode 1020, an adhesive layer 1030, a second electrode 1040, and a plurality of semiconductor light-emitting devices 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display apparatus. In addition, any one may be used if it is an insulating and flexible material.

The substrate may be formed between the semiconductor light-emitting devices, and may have grooves 1092 sequentially arranged in one direction. The semiconductor light-emitting devices may be sequentially arranged in one direction with the grooves 1092 interposed therebetween.

According to the illustration, the first electrode 1020 may be located on the substrate 1010, and formed with a bar-shaped electrode elongated in one direction. The first electrode 1020 may be configured to perform the role of a data electrode.

Furthermore, the adhesive layer 1030 may be disposed between the substrate 1010 on which the first electrode 1020 is located and the semiconductor light-emitting device 1050. The adhesive layer 1030 may be formed such that the first electrode 1020 and the semiconductor light-emitting device 1050 are in physical contact with each other. Accordingly, the semiconductor light-emitting device 1050 and the first electrode 1020 may be connected to each other for electrical conduction. In addition, the adhesive layer 1030 may be formed of silver paste, tin paste, and solder paste. However, in the present embodiment, a case where the adhesive layer 1030 is solder is illustrated. However, this is merely an exemplary embodiment, and the present disclosure is not limited thereto.

Furthermore, in a structure disposed with the adhesive layer 1030, a material that does not flow current may be filled in a gap formed between the semiconductor light-emitting devices 1050. For such an example, the gap may be filled with polyimide 1070.

The first electrode 1020 and the second electrode 1040 may be disposed with the semiconductor light-emitting devices interposed therebetween. A plurality of second electrodes 1040 may be arranged in a direction intersecting a length direction of the first electrodes 1020. The first electrode 1020 and the second electrode 1040 are electrically connected by contact with the semiconductor light-emitting device 1050, and may be wiring electrodes.

According to the illustration, the second electrode 1040 may be located on the polyimide 1070. In other words, the polyimide 1070 may be located between the substrate 1010 and the second electrode 1040. By the structure described above, the plurality of semiconductor light-emitting devices 1050 are coupled by the adhesive layer 1030, and electrically connected to the first electrode 1020 and the second electrode 1040.

In another embodiment, the adhesive layer 1030 may be replaced with the foregoing anisotropic conductive film.

When the adhesive layer is formed of the anisotropic conductive film, the second electrode 1040 may be disposed on the anisotropic conductive film. In other words, the anisotropic conductive film is disposed between the substrate 1010 and the second electrode 1040. In addition, the plurality of semiconductor light-emitting devices 1050 are coupled by the anisotropic conductive film, and electrically connected to the first electrode 1020 and the second electrode 1040.

At this time, a reflective layer 1093 may be formed under the first electrode, that is, the wiring electrode. Furthermore, according to circumstances, a transparent insulating layer (not shown) containing silicon oxide (SiOx) may be formed on the substrate 1010 formed with the semiconductor light-emitting device 1050. When the transparent insulating layer is formed and then the second electrode 1040 is placed thereon, the second electrode 1040 may be located on the transparent insulating layer. Furthermore, the second electrode 1040 may be formed to be separated from the polyimide 1070 or the transparent insulating layer.

As shown in the drawing, the plurality of semiconductor light-emitting devices 1050 may form a plurality of rows in a direction parallel to a plurality of electrode lines provided in the first electrode 1020. However, the present disclosure is not necessarily limited thereto. For example, the plurality of semiconductor light-emitting devices 1050 may form a plurality of rows along the second electrode 1040.

Moreover, the display apparatus 1000 may further include a phosphor layer 1080 formed on the plurality of semiconductor light-emitting devices 1050. For example, the semiconductor light-emitting device 1050 is a blue semiconductor light-emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting device 1151a at a position implementing a red sub-pixel, and a green phosphor 1082 capable of converting blue light into green (G) light may be deposited on the blue semiconductor light-emitting device 1151b at a position implementing a green sub-pixel. Furthermore, only the blue semiconductor light-emitting device 1151c may be solely used at a portion constituting a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting device 1050 may be combined with a quantum dot (QD) instead of a phosphor to implement sub-pixels that emit red (R), green (G) and blue (B).

On the other hand, in order to improve the contrast of the phosphor layer 1080, the display apparatus may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are deposited. In this case, a phosphor layer may not be formed at a position corresponding to the blue semiconductor light-emitting device 1051, but the black matrix 1091 may be respectively formed at both sides thereof with a space that does not have the phosphor layer 1080 interposed therebetween (or with the blue light-emitting device 1151c interposed therebetween). The black matrix 1091 may serve as a partition wall preventing color mixing among phosphors.

On the other hand, the semiconductor light-emitting device 1050 of the present example has a structure that emits light to an upper surface thereof, and has a conductive electrode electrically connected to the wiring electrode on a lower surface thereof, and a side surface of which is covered by a passivation layer.

At this time, the conductive electrode may include a texturing surface formed on a portion exposed to the outside for electrical connection to the wiring electrode. The texturing surface is disposed on a lower surface of the semiconductor light-emitting device, thereby increasing a contact surface with the wiring electrode, and further facilitating adhesion to a temporary adhesive layer in the process of transferring the semiconductor light-emitting device. Hereinafter, the semiconductor light-emitting device will be described in more detail.

FIG. 13 is a conceptual view illustrating a semiconductor light-emitting device in FIG. 13 according to an embodiment of the present disclosure.

Furthermore, referring to the semiconductor light-emitting device 1050 according to the present example, the electrode of the semiconductor light-emitting device 1050 may be disposed above and below in the present example. Therefore, it has a great advantage of reducing chip size.

The semiconductor light-emitting device 1050 emits light to the upper surface, and has a conductive electrode electrically connected to the wiring electrode on the lower surface, and the side surface is surrounded by the passivation layer 1157. In this case, concavity and convexity due to texturing are formed on the conductive electrode on a lower surface of the semiconductor light-emitting device 1050, and a shear force between the semiconductor light-emitting device and bonding material is increased when performing transfer.

More specifically, referring to FIG. 13, the semiconductor light-emitting device 1050 according to an embodiment of the present disclosure includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, a second conductive electrode 1152 formed on the second conductive semiconductor layer 1153, and a passivation layer 1157.

The first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. In other words, a conductive electrode disposed under the semiconductor light-emitting device is a p-type electrode, and an n-type electrode is disposed on an upper surface of the semiconductor light-emitting device. However, the present disclosure is not limited thereto, and the first conductive type may be n-type and the second conductive type may be p-type.

The first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153. In addition, the active layer 1154 is disposed between the first conductive semiconductor layer 1155 and the second conductive semiconductor layer 1153 to emit light by a current flowing between the first conductive electrode 1156 and the second electrode 1040.

In addition, the passivation layer 1157 may be provided at the outermost side of the semiconductor light-emitting device 1050, to cover the semiconductor layer and the active layer, thereby improving stabilization characteristics of the semiconductor light-emitting device 1050. The insulating layer 1157 may cover the first conductive semiconductor layer 1155, the active layer 1154, the second conductive semiconductor layer 1153, and the first conductive electrode 1156 of the semiconductor light-emitting device 1050.

The passivation layer 1157 may include a first insulating portion 1157a and a second insulating portion 1157b. The first insulating portion 1157a may have a shape overlapping with part of one surface of the first conductive electrode 1156. Specifically, the first insulating portion 1157a may be formed to cover an edge of the first conductive electrode 1156, and may also form an annular shape. In addition, the first insulating portion 1157a may be formed to completely overlap with a lower surface of the first conductive electrode 1156.

The second insulating portion 1157b may have a shape surrounding a side surface of the first conductive electrode 1156, a side surface of the first conductive semiconductor layer 1155, and a side surface of the second conductive semiconductor layer 1153. In other words, the second insulating portion 1157b extends from a side surface of the conductive electrode to a side surface of the first conductive semiconductor layer of the semiconductor light-emitting device and a side surface of the second conductive semiconductor layer. The second insulating portion 1157b may form an insulating protective layer in a form of covering the semiconductor light-emitting device 1050 to further secure the stability of the semiconductor light-emitting device 1050. Furthermore, the first insulating portion 1157a and the second insulating portion 1157b may be continuous layers.

An insulating interface 1161 may be formed between the first conductive electrode and the first insulating portion, and an adhesive electrode 1156c may be disposed on the insulating interface. The adhesive electrode 1156c may be formed to have an area equal to or larger than that of the insulating interface 1161 to cover the insulating interface 1161. The adhesive electrode 1156c may be disposed on the insulating interface 1161, thereby improving a bonding force between the first conductive electrode 1156 and the insulating layer 1157. The adhesive electrode 1156c as a buffer metal may be a metal layer that improves a bonding force between the passivation material and the metal electrode material. In order to improve the bonding force, the adhesive electrode 1156c may include at least one of titanium (Ti), chromium (Cr), and nickel (Ni). In addition, the adhesive electrode 1156c may be formed at a thickness of 1 nm to 10 nm. The enumeration for the adhesive electrode is exemplary only, and the present disclosure is not limited thereto.

According to the illustration, the first conductive electrode 1156 is disposed in an insulating region 1156a covered by the passivation layer 1157 and through holes of the passivation layer 1157 to be electrically connected to the wiring electrode, and may have a concave-convex region 1156b whose surface is formed with concavity and convexity.

The insulating region 1156a may be a region covered by the first insulating portion 1157a of the passivation layer 1157. Therefore, the adhesive electrode may be disposed between the conductive electrode and the passivation layer in the insulating region. On the contrary, the concave and convex region 1156b is a region that is not covered by the first insulating portion, and may be a portion exposed to the outside. The surface of the insulating region 1156a may be formed as a flat surface.

The concave and convex region 1156b may include a plurality of fine grooves by a texturing process using etching, and the fine grooves may be formed in a portion where the wiring electrode covers the first conductive electrode 1156. To this end, the first conductive electrode 1156 may be formed of an etchable material.

The concave and convex region 1156b is formed in a portion where the wiring electrode and the conductive electrode overlap with each other. In this case, the etching may be a dry process using ICP, RIE, or a wet process using chemical etchant.

Meanwhile, the conductive electrode may include one or more metal layers, and the metal layers may include an antioxidant layer 1156d formed of at least one of gold (Au), silver (Ag), and platinum (Pt). Furthermore, the metal layers may include an ohmic contact layer 1156e that forms an ohmic contact with the first conductive semiconductor layer 1155. For an example, at least one of ITO, chromium (Cr), titanium (Ti), and nickel-silver (Ni—Ag) may constitute the ohmic contact layer 1156e of the first conductive electrode 1156b.

In this case, the concave and convex region 1156b may be formed in a process of removing the adhesive electrode 1156c. Using surface texturing, only part of the adhesive electrode 1156c may be removed, and at this time, foreign matter may also be removed. Specifically, the adhesive electrode 1156c may not be etched in a portion corresponding to the insulating region 1156a, but may be etched only in a portion corresponding to the concave and convex region 1156b. For a more specific example, a surface of the antioxidant layer 1156d may be formed with surface texturing of several tens of nanometers after dry etching on a flat surface of several nanometers. In other words, the concave and convex region 1156b may be formed on the surface of the antioxidant layer 1156d, and roughness may be increased according to the etching time.

As the semiconductor light-emitting device formed with the concave-convex region 1156b is transferred to a transfer substrate, a shear force to temporary bonding materials provided on the transfer substrate may be improved. In addition, when bonded to a wiring substrate, a contact area with the wiring electrode may be increased, thereby having an effect of increasing a bonding force to bonding materials such as solder or the like.

At this time, the wiring electrode and the conductive electrode may be electrically connected by solder, and a plurality of grooves corresponding to a protruding portion of the concave-convex region may be formed on the solder.

Meanwhile, in the present example, a plurality of grooves may also be formed on an upper surface of the semiconductor light-emitting device. More specifically, fine grooves may also be formed by texturing on an upper surface of the second conductive semiconductor layer. For example, N—GaN is exposed through the removal of Ga metal or u-GaN, and dry-etched using Ar, Cl2 & BCl3 gas phases, thereby having a texturing structure showing a step difference of about 100 nanometers.

The fine grooves on the upper surface may not only improve the light extraction efficiency of light emitted from the inside, but also secure a strong shear force due to a large surface area when forming the second conductive electrode.

As described above, in a display apparatus according to the present disclosure, not only a bonding force to a lower surface of a semiconductor light-emitting device may be improved through a concave-convex region, but also light reflected from a conductive electrode to the semiconductor light-emitting device may be more easily extracted.

Meanwhile, the structure of the present disclosure may be applied not only to the above-described vertical semiconductor light-emitting device, but also to a horizontal semiconductor light-emitting device. Hereinafter, this structure will be described in more detail with reference to FIGS. 14 and 15.

Figure 14:
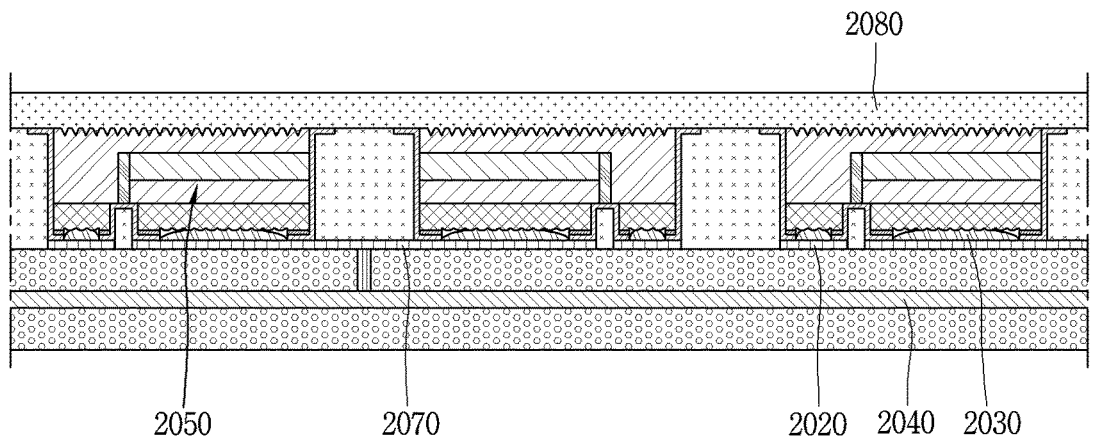
FIG. 14 is a cross-sectional view showing a display apparatus to which a horizontal semiconductor light-emitting device is applied.
Figure 15:
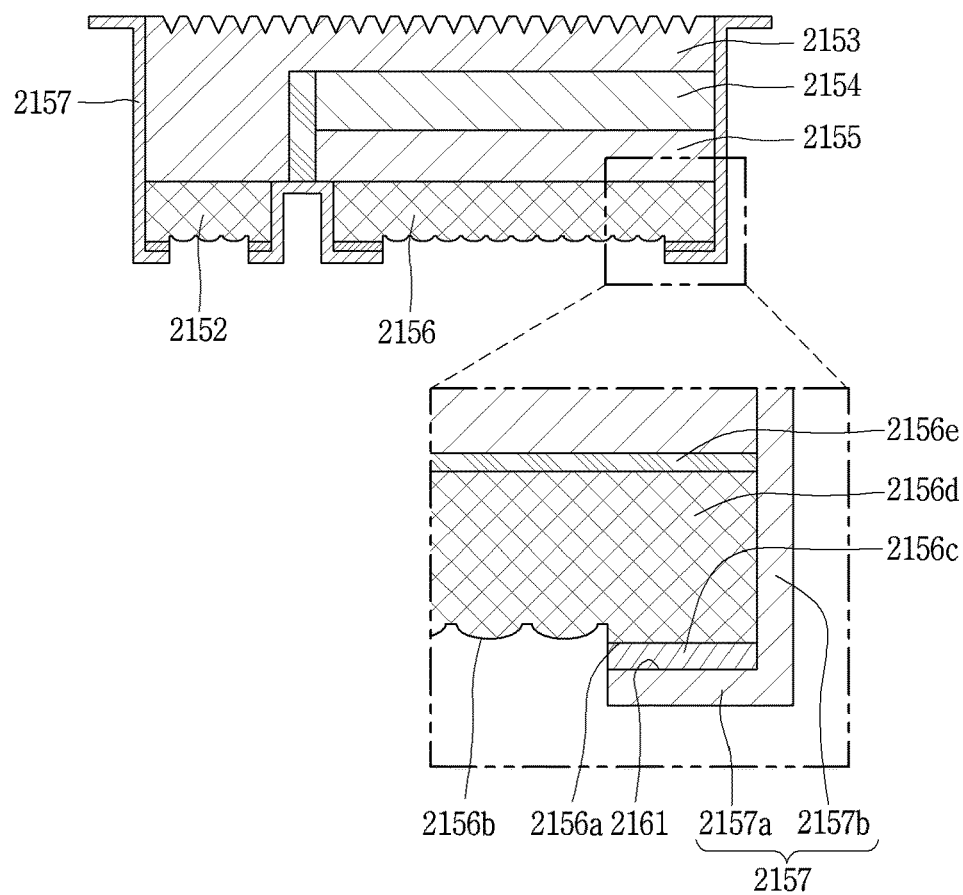
FIG. 15 is a conceptual view showing a horizontal semiconductor light-emitting device having a new structure disclosed in FIG. 14.

FIG. 14 is a cross-sectional view showing a display apparatus to which a horizontal semiconductor light-emitting device is applied, and FIG. 15 is a conceptual view showing a horizontal semiconductor light-emitting device having a new structure disclosed in FIG. 14.

According to the drawings in FIGS. 14 and 15, there is illustrated a display apparatus 2000 using a passive matrix (PM) type semiconductor light-emitting device as a display apparatus 2000 using a semiconductor light-emitting device. However, an example described below may also be applicable to an active matrix (AM) type semiconductor light-emitting device.

The display apparatus 2000 may include a substrate 2010, a first electrode 2020, an adhesive layer 2030, a second electrode 2040, an auxiliary electrode 2070, and a plurality of semiconductor light-emitting devices 2050.

The substrate 2010, as a wiring substrate on which the first electrode 2020 and the auxiliary electrode 2070 are disposed on one surface thereof, may include polyimide (PI). In addition, if it is an insulating material, any one such as polyethylene naphthalate (PEN), polyethylene terephthalate (PET) or the like may be used.

The second electrode 2040 may be disposed on the other surface of the substrate 2010, and electrically connected to the auxiliary electrode 2070 through a via hole. Here, the first electrode 2020 and the second electrode 2040 may each include a plurality of electrode lines, and the first electrode 2020 may serve as a data electrode, and the second electrode 2040 as a scan electrode.

The adhesive layer 2030 may be disposed between the first electrode 2020 and the auxiliary electrode 2070 and the semiconductor light-emitting device 2050. The adhesive layer 2030 may be formed such that the first electrode 2020 and the second electrode 2040 are in physical contact with the semiconductor light-emitting device 2050, and the description thereof will be replaced with the description of the adhesive layer described above with reference to FIGS. 10 to 13.

Moreover, the display apparatus 2000 may further include a phosphor layer 2080 and a black matrix 2091 formed on the plurality of semiconductor light-emitting devices 2050. The structures of the phosphor layer 2080 and the black matrix (not shown) are the same as those of the phosphor layer and the black matrix described above with reference to FIGS. 10 to 13, and the description thereof will be replaced with the above-described content.

On the other hand, the semiconductor light-emitting device 2050 of the present example has a structure that emits light to an upper surface thereof, and has a first conductive electrode 2156 and a second conductive electrode 2152 electrically connected to the wiring electrode on a lower surface thereof, and a side surface of which is covered by a passivation layer 2157.

In this case, concavity and convexity due to texturing are formed on the conductive electrode on a lower surface of the semiconductor light-emitting device 2050, and a shear force between the semiconductor light-emitting device and bonding material is increased when performing transfer.

More specifically, referring to FIG. 15, the semiconductor light-emitting device 2050 according to an embodiment of the present disclosure includes a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, a second conductive electrode 2152 formed on the second conductive semiconductor layer 2153, and a passivation layer 2157. Here, the second conductive electrode 2152 is horizontally spaced from the first conductive electrode 2156 on the second conductivity semiconductor layer 2153 to form a flip chip structure.

In this case, the first conductive electrode 2156 may be a p-type electrode, and the second conductive electrode 2152 may be an n-type electrode, and in the present example, a concave-convex region may be formed on the p-type electrode and the n-type electrode, respectively.

The passivation layer 2157 may include a first insulating portion 2157*a* and a second insulating portion 2157*b*. The first insulating portion 2157*a* may have a shape overlapping with part of the first conductive electrode 2156 and the second conductive electrode 2152. Specifically, the first insulating portion 2157*a* may be formed to cover an edge of the first conductive electrode 2156 and the second conductive electrode 2152, and may also form an annular shape. In addition, the first insulating portion 2157*a* may be formed to completely overlap with a lower surface of the first conductive electrode 2156 and the second conductive electrode 2152.

The second insulating portion 2157*b* may have a shape surrounding a side surface of the first conductive electrode 2156 and the second conductive electrode 2152, a side surface of the first conductive semiconductor layer 2155, and a side surface of the second conductive semiconductor layer 2153. In other words, the second insulating portion 2157*b* extends from a side surface of the conductive electrode to a side surface of the first conductive semiconductor layer of the semiconductor light-emitting device and a side surface of the second conductive semiconductor layer. The second insulating portion 2157*b* may form an insulating protective layer in a form of covering the semiconductor light-emitting device 2050 to further secure the stability of the semiconductor light-emitting device 2050. Furthermore, the first insulating portion 2157*a* and the second insulating portion 2157*b* may be continuous layers.

An insulating interface 2161 may be formed between the first conductive electrode 2156 and the second conductive electrode 2152 and the first insulating portion, and an adhesive electrode 2156*c* may be disposed on the insulating interface. The adhesive electrode 2156*c* may be formed to have an area equal to or larger than that of the insulating interface 2161 to cover the insulating interface 2161. The adhesive electrode 2156*c* may be disposed on the insulating interface 2161, thereby improving a bonding force between the first conductive electrode 2156 and the second conductive electrode 2152 and the passivation layer 2157. The detailed description of the adhesive electrode 2156*c* will be replaced with the foregoing content of the adhesive electrode 1156c in FIGS. 10 to 13.

According to the illustration, the first conductive electrode 2156 and the second conductive electrode 2152 are disposed in an insulating region 2156a covered by the passivation layer 2157 and through holes of the passivation layer 2157 to be electrically connected to the wiring electrode, and may have a concave-convex region 2156b whose surface is formed with concavity and convexity.

The insulating region 2156a may be a region covered by the first insulating portion 2157a of the passivation layer 2157. Therefore, the adhesive electrode 2156c may be disposed between the conductive electrodes 2152, 2156 and the passivation layer 2157 in the insulating region 2156a. On the contrary, the concave and convex region 2156b is a region that is not covered by the first insulating portion 2157a, and may be a portion exposed to the outside. The surface of the insulating region 2156a may be formed as a flat surface.

The concave-convex region 2156b may include a plurality of fine grooves in each of the first conductive electrode 2156 and the second conductive electrode 2152 by a texturing process using etching, and for this purpose, the first conductive electrode 2156 and the second conductive electrode 2152 may be formed of an etchable material.

Meanwhile, the conductive electrode may include one or more metal layers, and the metal layers may include an antioxidant layer 2156d formed of at least one of gold (Au), silver (Ag), and platinum (Pt). In addition, the metal layers may include an ohmic contact layer 2156e that forms an ohmic contact with a conductive semiconductor layer. For an example, at least one of ITO, chromium (Cr), titanium (Ti), and nickel-silver (Ni—Ag) may constitute the ohmic contact layer 2156e of the conductive electrode.

In this case, the concave and convex region 2156b may be formed in a process of removing the adhesive electrode 2156c. Using surface texturing, only part of the adhesive electrode is removed, and the detailed description thereof will be replaced with the content described above with reference to FIGS. 10 through 13.

As the semiconductor light-emitting device formed with the concave-convex region 2156b is transferred to a transfer substrate, a shear force to temporary bonding materials provided on the transfer substrate may be improved. In addition, when bonded to a wiring substrate, a contact area with the wiring electrode may be increased, thereby having an effect of increasing a bonding force to bonding materials such as solder or the like.

At this time, the wiring electrode and the conductive electrode may be electrically connected by solder, and a plurality of grooves corresponding to a protruding portion of the concave-convex region may be formed on the solder.

Meanwhile, in the present example, a plurality of grooves may also be formed on an upper surface of the semiconductor light-emitting device. The plurality of grooves on the upper surface may improve the light extraction efficiency of light emitted from the inside. According to the structure of the display apparatus in the present example, a concave and convex region may be formed on the p-type electrode and the n-type electrode of the horizontal semiconductor light-emitting device, respectively, thereby increasing a bonding force to bonding materials in the transfer process, and increasing a shear force to the wiring electrode when bonding to the wiring board.

In a display apparatus according to the present disclosure, not only a bonding force to a lower surface of a semiconductor light-emitting device may be improved through a concave-convex region, but also light reflected from a conductive electrode to the semiconductor light-emitting device may be more easily extracted.

Furthermore, in the present disclosure, an adhesive electrode may be formed on part of the conductive electrode of the semiconductor light-emitting device grown on a large area wafer, thereby improving a bonding force between the conductive electrode and a passivation layer in the semiconductor light-emitting device.

In addition, in the present disclosure, a larger contact area between the conductive electrode having a large resistance component and a wiring may be formed, thereby efficiently performing current injection into the semiconductor light-emitting device. Through this, an operating voltage of the semiconductor light-emitting devices may be reduced.

Moreover, in the present disclosure, a texturing surface (a structure having a size of several tens of nm to 100 nm or more) may be formed on a light emitting surface (LES) interface through a dry etching process to reduce total internal reflectance in terms of light extraction on the LES interface, thereby improving light extraction efficiency.

The configurations and methods according to the above-described embodiments will not be applicable in a limited way to the foregoing display apparatus using a semiconductor light-emitting device, and all or part of each embodiment may be selectively combined and configured to make various modifications thereto.

What is claimed is:

1. A display apparatus, comprising:
   a substrate having a wiring electrode; and
   a semiconductor light-emitting device that emits light to an upper surface thereof, has a conductive electrode electrically connected to the wiring electrode on a lower surface thereof, and has at least a side surface of which is covered by a passivation layer,
   wherein the conductive electrode comprises:
      an insulating region formed as a flat surface and as an annular shape to cover an edge of the conductive electrode by the passivation layer in a first portion thereof, and
      a concave-convex region exposed by the passivation layer and electrically connected to the wiring electrode in a second portion thereof, a surface of the concave-convex region being formed with concavity and convexity,
   wherein a plurality of grooves are formed on an upper surface of the semiconductor light-emitting device, and
   wherein an adhesive electrode is disposed between the conductive electrode and the passivation layer and is formed as the annular shape in the first portion of the insulating region.

2. The display apparatus of claim 1, wherein the concave-convex region is formed in the second portion of the conductive electrode where the wiring electrode and the conductive electrode overlap with each other.

3. The display apparatus of claim 2, wherein the conductive electrode further includes an n-type electrode disposed on the upper surface of the semiconductor light-emitting device, and
   wherein the conductive electrode is a p-type electrode.

4. The display apparatus of claim 2, wherein the conductive electrode comprises a p-type electrode and an n-type electrode, and
   wherein the concave-convex region is formed on the p-type electrode and the n-type electrode, respectively.

5. The display apparatus of claim 1, wherein the conductive electrode has one or more metal layers, and the one or more metal layers comprise an antioxidant layer formed of at least one of gold (Au), silver (Ag) and platinum (Pt).

6. The display apparatus of claim 5, wherein the concave-convex region is formed on a surface of the antioxidant layer.

7. The display apparatus of claim 1, wherein the plurality of grooves are formed on an upper surface of a second conductive semiconductor layer of the semiconductor light-emitting device, and
wherein the semiconductor light-emitting device has a second conductive electrode formed on one edge portion of the upper surface on which the plurality of grooves are not formed.

8. The display apparatus of claim 1, wherein the adhesive electrode is removed in the second portion corresponding to the concave-convex region through an etching process, and
wherein the adhesive electrode is not etched in the first portion corresponding to the insulating region during the etching process.

9. The display apparatus of claim 8, wherein the semiconductor light-emitting device further comprises a first conductive semiconductor layer on the conductive electrode and a second conductive semiconductor layer on the first conductive semiconductor layer, and
wherein the passivation layer comprises a first insulating portion formed on a lower surface of the conductive electrode, and a second insulating portion extended from the side surface of the conductive electrode to a side surface of the first conductive semiconductor layer and a side surface of the second conductive semiconductor layer of the semiconductor light-emitting device.

10. The display apparatus of claim 9, wherein an insulating interface is formed between the first conductive electrode and the first insulating portion, and
wherein the adhesive electrode is disposed on the insulating interface.

11. The display apparatus of claim 8, wherein the adhesive electrode comprises at least one of titanium (Ti), chromium (Cr) and nickel (Ni).

12. The display apparatus of claim 1, wherein the wiring electrode and the conductive electrode are electrically connected by solder, and
wherein grooves corresponding to a protruding portion of the concave-convex region are formed on the solder.

13. The display apparatus of claim 1, wherein the plurality of grooves are finer than the concavity and convexity of the concave-convex region.

14. The display apparatus of claim 1, wherein a reflective layer is formed under the wiring electrode.

15. The display apparatus of claim 1, wherein the semiconductor light-emitting device includes a plurality of semiconductor light-emitting devices, and
wherein the substrate comprises grooves formed between the plurality of semiconductor light-emitting devices, and sequentially arranged in one direction of the substrate.

16. The display apparatus of claim 1, wherein a through hole is formed in the passivation layer to expose the concave-convex region.

17. A display apparatus, comprising:
a semiconductor light-emitting device that emits light to an upper surface of the semiconductor light-emitting device, and having a conductive electrode connected to a substrate on a lower surface of the semiconductor light-emitting device,
wherein the conductive electrode comprises:
a first region and a second region on a surface thereof facing the substrate, the first region and the second region having different surface texturing from each other,
wherein the first region is an insulating region formed as a flat surface as an annular shape to cover an edge of the conductive electrode by a passivation layer formed on a side surface of the semiconductor light-emitting device,
wherein the second region is a concave-convex region exposed by the passivation layer, a surface of the concave-convex region being formed with concavity and convexity,
wherein a plurality of grooves are formed on the upper surface of the semiconductor light-emitting device, and
wherein an adhesive electrode is disposed between the conductive electrode and the passivation layer and is formed as the annular shape in the first region.

18. The display apparatus of claim 17, wherein the adhesive electrode is removed in the second region corresponding to the concave-convex region through an etching process, and
wherein the adhesive electrode is not etched in the first region corresponding to the insulating region during the etching process.

19. The display apparatus of claim 17, wherein the surface of the concave-convex region of the second region is recessed further into the conductive electrode than the flat surface the insulating region of the first region.

20. The display apparatus of claim 17, wherein the plurality of grooves are formed on an upper surface of a second conductive semiconductor layer of the semiconductor light-emitting device, and
wherein the semiconductor light-emitting device has a second conductive electrode formed on one edge portion of the upper surface on which the plurality of grooves are not formed.

* * * * *